(12) United States Patent
Kawaguchi

(10) Patent No.: US 7,732,823 B2
(45) Date of Patent: Jun. 8, 2010

(54) LIGHT EMITTING DEVICE AND SEMICONDUCTOR DEVICE

(75) Inventor: Kenichi Kawaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 45 days.

(21) Appl. No.: 11/882,988

(22) Filed: Aug. 8, 2007

(65) Prior Publication Data
US 2008/0006817 A1 Jan. 10, 2008

Related U.S. Application Data

(63) Continuation of application No. PCT/JP2005/001921, filed on Feb. 9, 2005.

(51) Int. Cl.
*H01L 27/15* (2006.01)
*H01L 29/08* (2006.01)
*H01S 5/00* (2006.01)

(52) U.S. Cl. ............... 257/79; 257/12; 372/45

(58) Field of Classification Search ............ 257/79, 257/12, 13, 14, 80, 184, 631; 372/45, 92; 438/22, 28, 46
See application file for complete search history.

(56) References Cited

U.S. PATENT DOCUMENTS

| 5,523,592 | A | 6/1996 | Nakagawa et al. | |
|---|---|---|---|---|
| 5,970,361 | A | 10/1999 | Kumomi et al. | |
| 6,403,975 | B1 * | 6/2002 | Brunner et al. | 257/15 |
| 6,445,000 | B1 * | 9/2002 | Masalkar et al. | 257/21 |
| 6,548,835 | B1 * | 4/2003 | Ebeling | 257/94 |
| 6,570,187 | B1 * | 5/2003 | Pautrat et al. | 257/79 |
| 6,573,527 | B1 | 6/2003 | Sugiyama et al. | |
| 2006/0115917 | A1 * | 6/2006 | Linden | 438/46 |

FOREIGN PATENT DOCUMENTS

| JP | 6-77102 | 3/1994 |
|---|---|---|
| JP | 6-232448 | 8/1994 |
| JP | 8-8488 | 1/1996 |
| JP | 9-326506 | 12/1997 |
| JP | 2003-502847 | 1/2003 |
| JP | 2003-158074 | 5/2003 |

OTHER PUBLICATIONS

R. Heitz, et al.; "Optical properties of InAs quantum dots in a Si matrix;" *Applied Physics Letters*; vol. 74; No. 12; Mar. 22, 1999; pp. 1701-1703.

Q. Mi, et al.; "Room-temperature 1.3 μm electroluminescence from strained $Si_{1-x}Ge_x$/Si quantum wells;" *Applied Physics Letters*; vol. 60; No. 25; Jun. 1992, 1992; pp. 3177-3179.

(Continued)

*Primary Examiner*—Howard Weiss
*Assistant Examiner*—Steven H Rao
(74) *Attorney, Agent, or Firm*—Kratz, Quintos & Hanson, LLP

(57) ABSTRACT

In order to make it possible to grow up a light emitting device easily on a substrate made of a Si material system while production of an anti-phase domain can be prevented and a sufficiently high luminous efficiency can be obtained, the light emitting device is configured as a device which includes a substrate (1) formed from a Si material system, a $Si_{1-x-y}Ge_xC_y$ ($0<x\leq 1$, $0\leq y\leq 0.005$) layer (2) and quantum dots (3) made of a direct transition type compound semiconductor. The quantum dots (3) are included in the $Si_{1-x-y}Ge_xC_y$ ($0<x\leq 1$, $0\leq y\leq 0.005$) layer (2) formed on the substrate (1).

8 Claims, 11 Drawing Sheets

OTHER PUBLICATIONS

H. J. Osten; "SiGeC Materials;" *Semiconducting and Semi-Insulating Materials Conference, IEEE*; Apr. 29, 1996-May 3, 1996; pp. 195-200.

K. Eisenbeiser, et al; "GaAs MESFETs Fabricated on Si Substrates Using a SrTiO$_3$ Buffer Layer;"*IEEE Electron Device Letters*; vol. 23; No. 6; Jun. 2002; pp. 300-302.

* cited by examiner

LIGHT EMITTING DEVICE AND SEMICONDUCTOR DEVICE

This application is a continuation of international application PCT/JP05/001921 filed Feb. 9, 2005.

TECHNICAL FIELD

The present invention relates to a light emitting device (light emitting element) suitable for use, for example, as a light emitting device wherein compound semiconductor quantum dots are included in a silicon semiconductor material system and a semiconductor device which includes the light emitting device.

BACKGROUND ART

In recent years, in order to implement an optical interconnection between chips or an optoelectronic integrated circuit (OEIC), a light emitting device which can be grown up directly on a silicon (Si) substrate is demanded.

To this end, various methods have been attempted such as, for example, (1) a method wherein a rare earth element compound is doped as the luminescence center into Si, (2) another method wherein a group III-V compound semiconductor light emitting device which exhibits a high luminous efficiency is directly grown up on a Si substrate, and (3) a further method wherein a group III-V compound semiconductor light emitting device which exhibits a high luminous efficiency is formed on a GaAs substrate and then this is stuck to a Si substrate.

For example, Non-Patent Document 1 is known as a technique regarding an optical characteristic of InAs quantum dots in Si. Further, since, if it is tried to directly grow up a compound semiconductor on a Si substrate, then an anti-phase domain is produced, there is a technique that a buffer layer made of $SrTiO_3$ (STO) or the like is inserted between Si and a compound semiconductor in a high-frequency device such as, for example, aMESFET (refer to Non-Patent Document 2).

Non-Patent Document 1: Heitz et al. "Optical properties of InAs quantum dots in a Simatrix" APPLIED PHYSICS LETTERS, Vol. 74, No. 12, 22 Mar. 1999, p. 1701

Non-Patent Document 2: Eisenbeiser et al. "GaAs MESFETs Fabricated on Si Substrates Using a SrTiO3 Buffer Layer" IEEE ELECTRON DEVICE LETTERS, VOL. 23, NO. 6, June 2002, p. 300.

DISCLOSURE OF THE INVENTION

Subject to be Solved by the Invention

Incidentally, as a material for implementing a heterostructure having high quality on a Si substrate, $Si_{1-x}Ge_x$ ($0<x\leq1$) which is mixed crystal of Si and germanium (Ge) which is an element of the group IV same as that of Si is available.

However, since $Si_{1-x}Ge_x$ ($0<x\leq1$) is an indirect transition type semiconductor, where a light emitting layer is formed from $Si_{1-x}Ge_x$ ($0<x\leq1$), there is a subject that the luminous efficiency is very low.

On the other hand, the method (1) described above has a subject that the luminous efficiency is insufficient at a room temperature. Further, it further has a subject that it is impossible to design the wavelength arbitrarily.

Meanwhile, according to the method (2) described above, if it is tried to directly grow up a group III-V compound semiconductor having a polarity on a non-polar Si substrate, then a region (anti-phase domain) wherein the polarity is inversed in a plane appears. Since the inversion of the polarity cannot be controlled, if a region wherein the polarity is inversed appears once, then a perfect crystal structure cannot be obtained, and the luminous efficiency decreases remarkably.

Further, the method (3) described above has a subject that, since a GaAs substrate must be removed after it is stuck to a Si substrate, labor and time are required. Further, where devices are integrated, group III-V compound semiconductor light emitting devices are formed on a GaAs substrate, and each of the devices is cut out in a predetermined size and is then stuck to a Si substrate. However, there is a subject that, since the size of the cut out device is small, labor and time are required. Particularly, if the number of devices to be integrated increases, then labor and time required for integration of devices become unignorable.

In the technique disclosed in Non-Patent Document 2 and described above, since a layer formed from a different material such as STO or the like is inserted between Si and a compound semiconductor. Therefore, there is a subject that the formation process becomes complicated and so forth. It is to be noted that, at present, an example wherein this technique is applied to a light emitting device is not available.

The present invention has been made in view of such subjects as described above and it is an object of the present invention to provide a light emitting device which can be grown up easily on a substrate made of a Si material system while production of an anti-phase domain is prevented and a sufficiently high luminous efficiency can be implemented and a semiconductor device which includes the light emitting device. Also it is an object of the present invention to make it possible to arbitrarily design the emission wavelength by a light emitting device.

Means for Solving the Subject

To this end, the light emitting device of the present invention comprises a substrate made of a Si material system, a $Si_{1-x-y}Ge_xC_y$ ($0<x\leq1$, $0\leq y\leq0.005$) layer, and quantum dots made of a direct transition type compound semiconductor, the quantum dots being provided in the $Si_{1-x-y}Ge_xC_y$ ($0<x\leq1$, $0\leq y\leq0.005$) layer formed above the substrate.

A semiconductor device of the present invention comprises the light emitting device described above.

Meanwhile, another semiconductor apparatus of the present invention is configured by integrating the light emitting device described above and an electron device.

Effects of the Invention

Accordingly, with the light emitting device of the present invention, there is an advantage that the light emitting device can be grown up easily on a substrate made of a Si material system while production of an anti-phase domain is prevented and a sufficiently high light emission efficiency can be obtained. Consequently, a semiconductor apparatus can be implemented wherein a light emitting device capable of obtaining a sufficiently high light emission efficiency and an electronic device are integrated. Also there is an advantage that an emission wavelength of the light emitting device can be designed arbitrarily.

Figure 1:
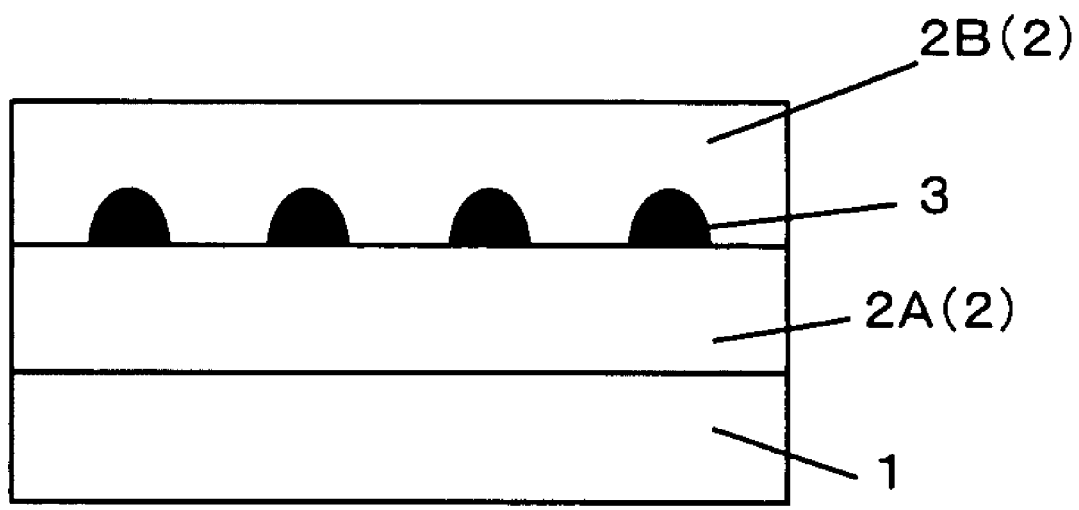
FIG. 1 is a schematic view showing a configuration of a light emitting device according to a first embodiment of the present invention.

DESCRIPTION OF REFERENCE NUMERALS 1 substrate
2, 20 barrier layer
2A, 20A underlying layer
2B, 20B cap layer
3 quantum dot
11 Si buffer layer
12 graded composition buffer layer
13 n-type contact layer
14 p-type contact layer
15 n-side electrode
16 p-side electrode
40 light emitting element
41 photodetector
42 electronic circuit Best Mode for Carrying Out of the Invention In the following, light emitting devices and semiconductor devices which include the light emitting devices according to embodiments of the present invention are described with reference to FIGS. 1 to 11.

First Embodiment

First, a light emitting device (light emitting element) according to a first embodiment of the present invention is described with reference to FIGS. 1 to 9.

As shown in FIG. 1, the light emitting device according to the present embodiment includes a silicon (Si) substrate 1, a $Si_{1-x-y}Ge_xC_y$ ($0<x\leq1$, $0\leq y\leq0.005$) layer (Ge layer or group IV semiconductor mixed crystal layer including Si) 2 and quantum dots 3 made of a direct transition type compound semiconductor, and has a configuration wherein the quantum dots 3 are buried in the $Si_{1-x-y}Ge_xC_y$ ($0<x\leq1$, $0\leq y\leq0.005$) layer 2 formed above the Si substrate 1.

Here, while the layer (base material layer) 2 used as a base material in which the quantum dots 3 are buried is formed from the $Si_{1-x-y}Ge_xC_y$ ($0<x\leq1$, $0\leq y\leq0.005$) layer, particularly from a view point of facility upon fabrication, it is preferable to use a SiGe layer or a SiGeC layer (group IV semiconductor mixed crystal layer including Si) as the layer 2. It is to be noted that, since the base material layer 2 is made of a material having an energy gap greater than transition energy of the quantum dots 3, the base material layer 2 is sometimes called barrier layer.

Preferably, as the direct transition type compound semiconductor which is a material of the quantum dots 3, one of materials of the group consisting of $InAs_{1-a}Sb_a$ ($0\leq a\leq1$), $In_{1-b}Ga_bSb$ ($0\leq b<1$), $InSb_{1-c}N_c$ ($0\leq c\leq1$), and $InAs_{1-d}N_d$ ($0\leq d\leq1$) is used.

While a Si substrate is used as the substrate 1, any substrate made of a Si material system (that is, Si or group IV semiconductor mixed crystal including Si) may be used.

Figure 2:
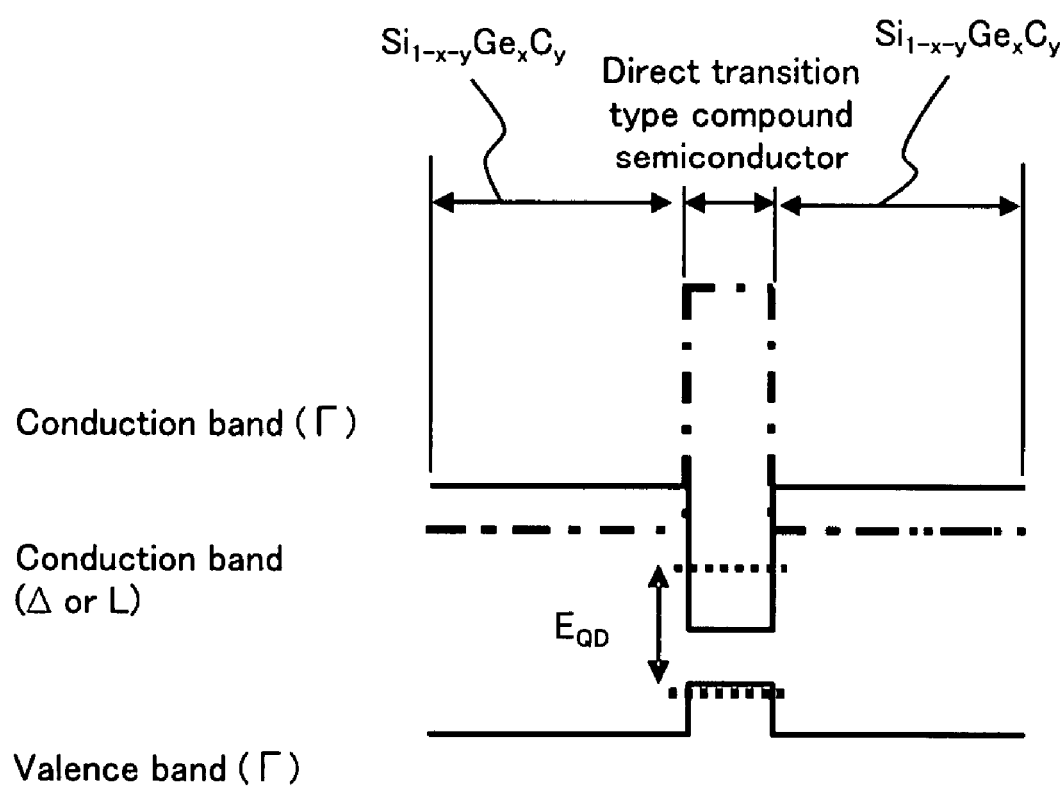
FIG. 2 is a view showing an energy band structure of $Si_{1-x-y}Ge_xC_y$ ($0<x\leq1$, $0\leq y\leq0.005$) and a direct transition type compound semiconductor which form the light emitting device according to the first embodiment of the present invention.

Here, FIG. 2 is a view showing an energy band structure of $Si_{1-x-y}Ge_xC_y$ ($0<x\leq1$, $0\leq y\leq0.005$) which forms the barrier layer 2 and the direct transition type compound semiconductor buried in the barrier layer 2 which forms the quantum dots 3. It is to be noted that, in FIG. 2, the energy levels of the conduction band and the valence band at the Γ point are indicated by solid lines and then energy level at the Δ or L point of the conduction band is indicated by an alternate long and short dash line while the quantum level (ground level) is indicated by a dotted line. Meanwhile, $E_{QD}$ indicates the transition energy.

As shown in FIG. 2, in the present embodiment, the barrier layer 2 is made of $Si_{1-x-y}Ge_xC_y$ ($0<x\leq1$, $0\leq y\leq0.005$) and the quantum dots 3 are made of a direct transition type compound semiconductor so that the ground level at the Γ point of the conduction band of the direct transition type compound semiconductor quantum dots 3 becomes lower than the conduction band minimum (Δ or L point) of the barrier layer 2.

Incidentally, $Si_{1-x-y}Ge_xC_y$ (0<x≦1, 0≦y≦0.005) is an indirect transition type semiconductor wherein the peak of the valence band is the Γ point and the conduction band minimum is the Δ point where x<0.85, but is the L point where x≦0.85.

Therefore, as described in the column of the subject of the present invention given hereinabove, where a light emitting layer is made of $Si_{1-x-y}Ge_xC_y$ (0<x≦1, 0≦y≦0.005), the luminous efficiency is extremely low.

On the other hand, if the structure is applied that the quantum dots 3 made of a direct transition type compound semiconductor are buried in the barrier layer 2 made of $Si_{1-x-y}Ge_xC_y$ (0<x≦1, 0≦y≦0.005), then the ground level at the Γ point of the conduction band of the direct transition type compound semiconductor quantum dots 3 becomes lower than the conduction band minimum (Δ or L point) of the barrier layer 2 made of $Si_{1-x-y}Ge_xC_y$ (0<x≦1, 0≦y≦0.005), and both of electrons and holes are trapped in the quantum dots 3 as seen in FIG. 2. Therefore, light emission can be implemented with an efficiency equal to that in the case wherein a light emitting layer is made only of a direct transition type semiconductor.

Here, FIGS. 3 to 9 indicate variations of the energy band structure [variations of the energy level at the Γ point, L point and Δ point of the conduction band of $Si_{1-x}Ge_x$ (0<x≦1) and at the Γ point of the valence band] in accordance with the Ge ratio of $Si_{1-x}Ge_x$ (0<x≦1) which forms the barrier layer 2 and a variation of the energy level of the ground level (quantum level) at the Γ point of the conduction band of the direct transition type compound semiconductor quantum dots 3 buried in $Si_{1-x}Ge_x$ (0<x≦1).

Figure 3:
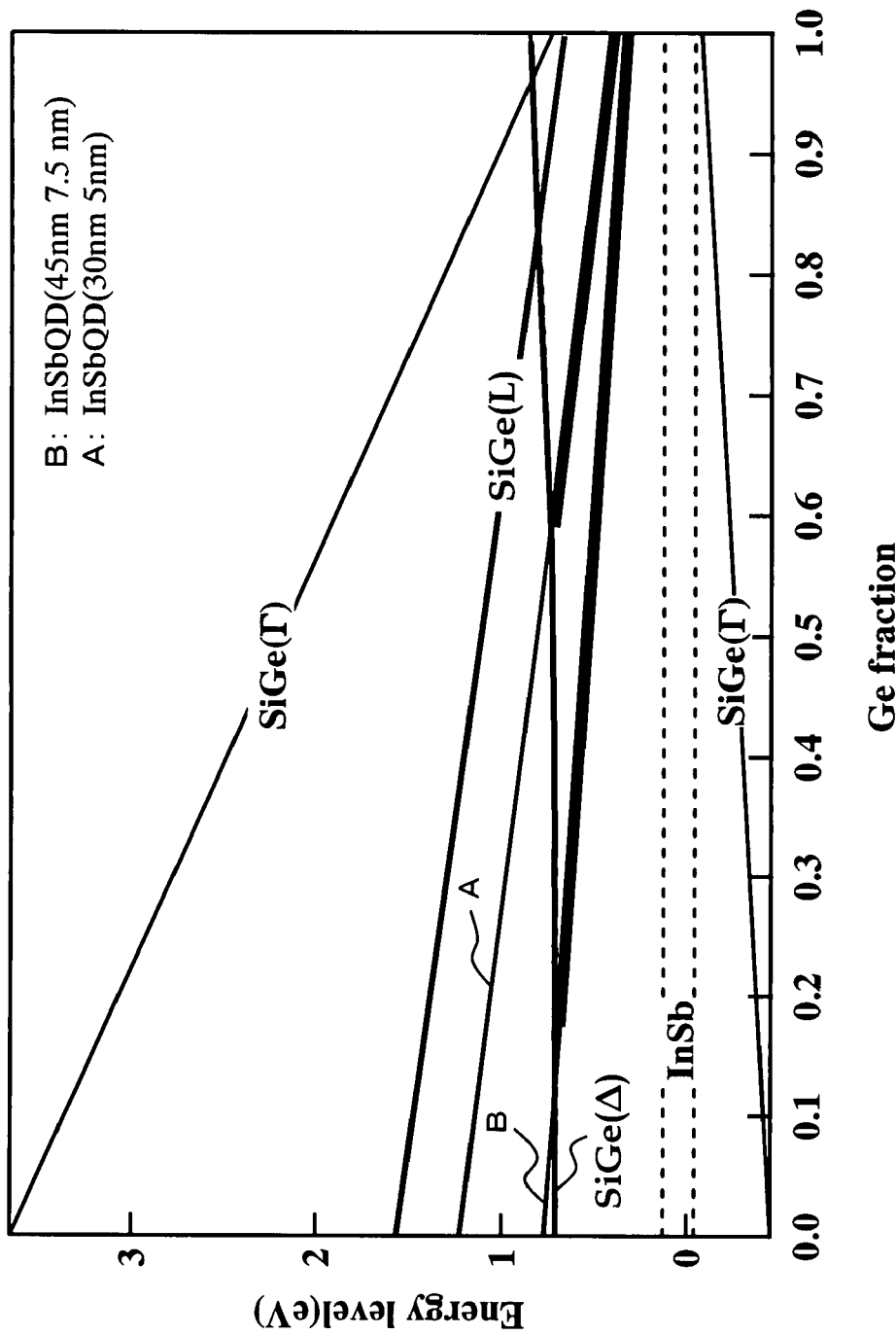
FIG. 3 is a view illustrating a variation of the energy band structure in response to the Ge ratio of $Si_{1-x}Ge_x$ ($0<x\leq1$) and a variation of the energy level of the ground level at the Γ point of a conduction band of direct transition type compound semiconductor quantum dots (InSb quantum dots) which form the light emitting device according to the first embodiment of the present invention.

FIG. 3 indicates the variations where InSb is used as the direct transition type compound semiconductor (InSb quantum dots; InSbQD), and FIG. 4 indicates the variations where InAsSb is used as the direct transition type compound semiconductor (InAsSb quantum dots; InAsSbQD). FIG. 5 indicates the variations where InAs is used as the direct transition type compound semiconductor (InAs quantum dots; InAsQD), and FIG. 6 indicates the variations where InGaSb is used as the direct transition type compound semiconductor (InGaSb quantum dots; InGaSbQD). FIG. 7 indicates the variations where InSbN is used as the direct transition type compound semiconductor (InSbN quantum dots; InSbNQD), and FIG. 8 indicates the variations where InN is used as the direct transition type compound semiconductor (InN quantum dots; InNQD). Further, FIG. 9 indicates the variations where InAsN is used as the direct transition type compound semiconductor (InAsN quantum dots; InAsNQD).

It is to be noted that, in FIGS. 3 to 9, as a variation of the energy level of the ground level (quantum level) at the Γ point of the conduction band of the direct transition type compound semiconductor quantum dots 3, a variation (indicated by a solid line to which a reference character A is applied) wherein the size of the quantum dots 3 is set such that the bottom length is 30 nm and the height is 5 nm and another variation (indicated by a solid line to which a reference character B is applied; maximum size of the quantum dots) wherein the size of the quantum dots 3 is set such that the bottom length is 45 nm and the height is 7.5 nm are shown.

Then, in the quantum dots 3 of individual sizes, a region wherein the energy band structure shown in FIG. 2 can be implemented is indicated by a thick line. Meanwhile, in FIGS. 3 to 9, two dotted lines individually indicate the conduction band minimum (Γ point) of the material of the quantum dots 3 and the peak (Γ point) of the valence band.

First, in a case wherein the InSb quantum dots 3 are buried in the barrier layer 2 made of $Si_{1-x}Ge_x$ (0<x≦1), where the size of the quantum dots 3 is set such that the bottom length is 30 nm and the height is 5 nm, it is recognized that, if the value of x which indicates the ratio of Ge is within a range of 0.6≦x≦1 as indicated by the thick line on the solid line to which the reference character A is applied in FIG. 3, then the energy band structure shown in FIG. 2 can be implemented. Therefore, where the size of the quantum dots 3 is set such that the bottom length is 30 nm and the height is 5 nm, if the composition ratio of Ge is adjusted within the range specified as above, then a sufficiently high luminous efficiency equal to that of a case wherein the light emitting layer is made only of a direct transition type semiconductor can be obtained.

Meanwhile, where the size of the quantum dots 3 is set such that the bottom length is 45 nm and the height is 7.5 nm, it is recognized that, if the value of x which indicates the ratio of Ge is within a range of 0.18≦x ≦1 as indicated by the thick line on the solid line to which the reference character B is applied in FIG. 3, then the energy band structure shown in FIG. 2 can be implemented. Therefore, where the size of the quantum dots 3 is set such that the bottom length is 45 nm and the height is 7.5 nm, if the composition ratio of Ge is adjusted within the range specified as above, then a sufficiently high luminous efficiency equal to that of a case wherein the light emitting layer is formed only from a direct transition type semiconductor can be obtained.

Figure 4:
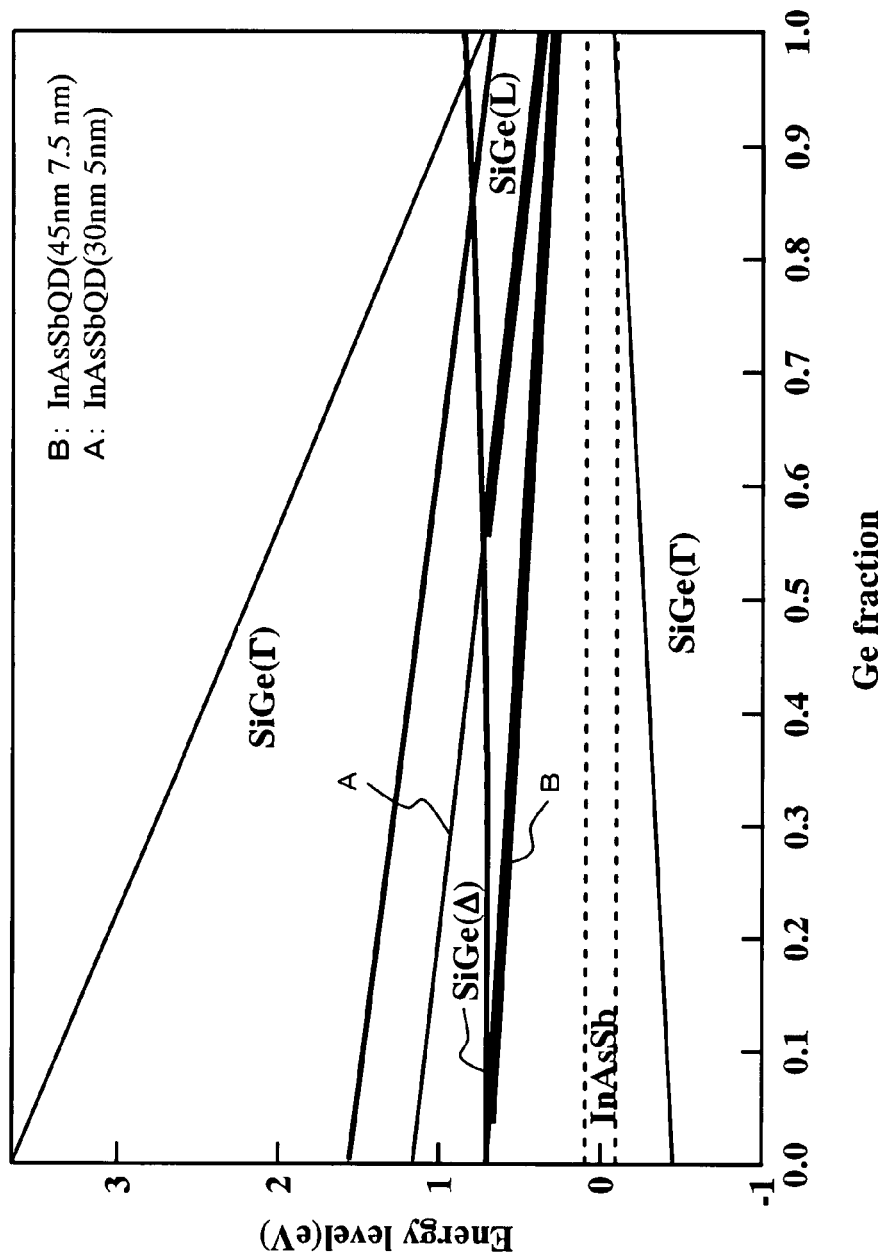
FIG. 4 is a view illustrating a variation of the energy band structure in response to the Ge ratio of $Si_{1-x}Ge_x$ ($0<x\leq1$) and a variation of the energy level of the ground level at the Γ point of a conduction band of direct transition type compound semiconductor quantum dots (InAsSb quantum dots) which form the light emitting device according to the first embodiment of the present invention.
Figure 5:
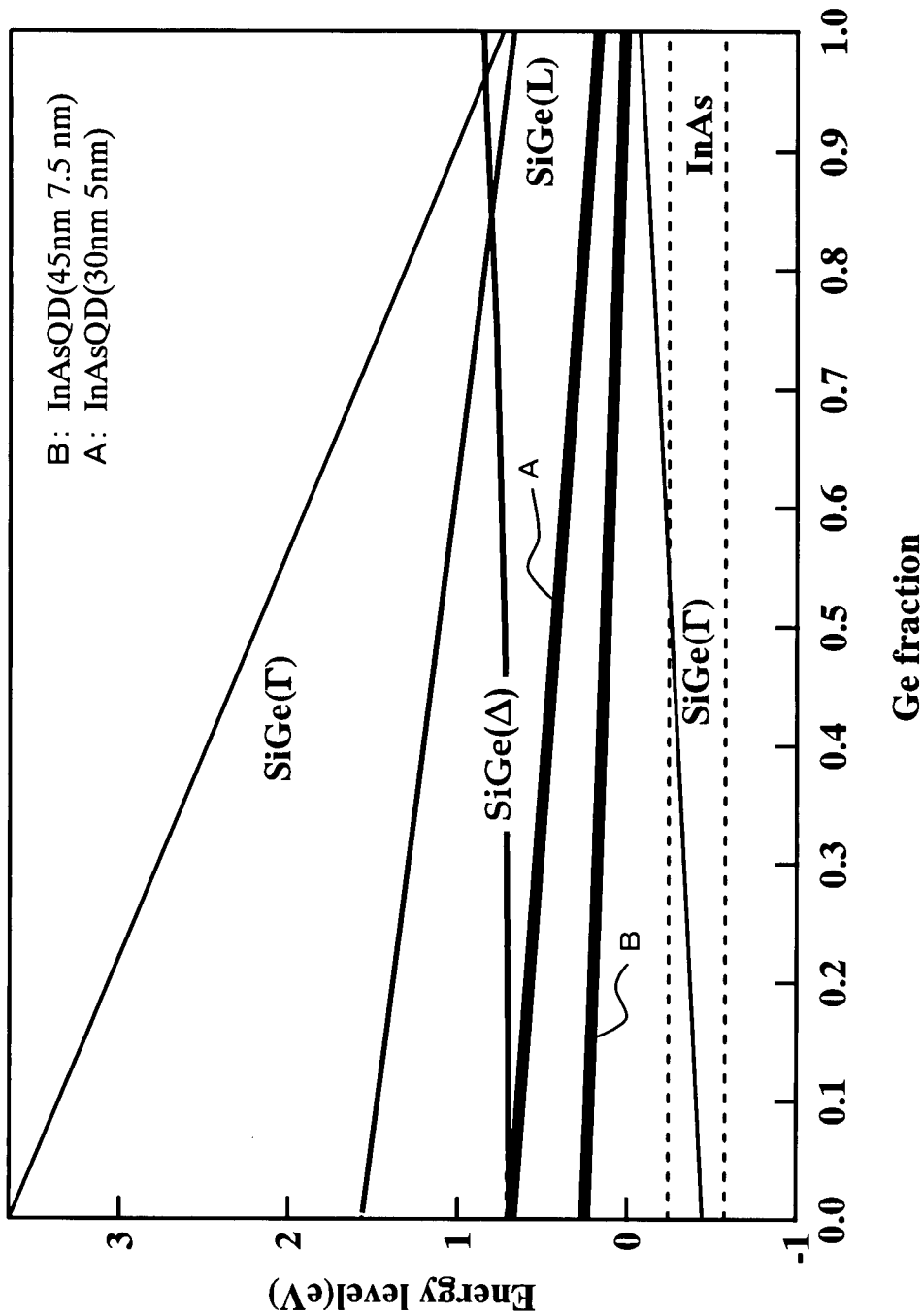
FIG. 5 is a view illustrating a variation of the energy band structure in response to the Ge ratio of $Si_{1-x}Ge_x$ ($0<x\leq1$) and a variation of the energy level of the ground level at the Γ point of a conduction band of direct transition type compound semiconductor quantum dots (InAs quantum dots) which form the light emitting device according to the first embodiment of the present invention.

Next, in a case wherein the InAsSb quantum dots 3 are buried in the barrier layer 2 made of $Si_{1-x}Ge_x$ (0<x≦1), where the size of the quantum dots 3 is set such that the bottom length is 30 nm and the height is 5 nm, it is recognized that, if the value of x which indicates the ratio of Ge is within a range of 0.55≦x≦1 as indicated by the thick line on the solid line to which the reference character A is applied in FIG. 4, then the energy band structure shown in FIG. 2 can be implemented. Therefore, where the size of the quantum dots 3 is set such that the bottom length is 30 nm and the height is 5 nm, if the composition ratio of Ge is adjusted within the range specified as above, then a sufficiently high luminous efficiency equal to that of a case wherein the light emitting layer is made only of a direct transition type semiconductor can be obtained.

On the other hand, where the size of the quantum dots 3 is set such that the bottom length is 45 nm and the height is 7.5 nm, it is recognized that, if the value of x which indicates the ratio of Ge is within a range of 0.03≦x≦1 as indicated by the thick line on the solid line to which the reference character B is applied in FIG. 4, then the energy band structure shown in FIG. 2 can be implemented. Therefore, where the size of the quantum dots 3 is set such that the bottom length is 45 nm and the height is 7.5 nm, if the composition ratio of Ge is adjusted within the range specified as above, then a sufficiently high luminous efficiency equal to that of a case wherein the light emitting layer is made only of a direct transition type semiconductor can be obtained.

Next, in a case wherein the InAs quantum dots 3 are buried in the barrier layer 2 made of $Si_{1-x}Ge_x$ (0<x≦1), where the size of the quantum dots 3 is set such that the bottom length is 30 nm and the height is 5 nm, it is recognized that, if the value of x which indicates the ratio of Ge is within a range of 0<x≦1 as indicated by the thick line on the solid line to which the reference character A is applied in FIG. 5, then the energy band structure shown in FIG. 2 can be implemented. Therefore, where the size of the quantum dots 3 is set such that the bottom length is 30 nm and the height is 5 nm, if the composition ratio of Ge is adjusted within the range specified as above, then a sufficiently high luminous efficiency equal to that of a case wherein the light emitting layer is made only of a direct transition type semiconductor can be obtained.

On the other hand, where the size of the quantum dots 3 is set such that the bottom length is 45 nm and the height is 7.5 nm, it is recognized that, if the value of x which indicates the ratio of Ge is within a range of $0<x\leq 1$ as indicated by the thick line on the solid line to which the reference character B is applied in FIG. 5, then the energy band structure shown in FIG. 2 can be implemented. Therefore, where the size of the quantum dots 3 is set such that the bottom length is 45 nm and the height is 7.5 nm, if the composition ratio of Ge is adjusted within the range specified as above, then a sufficiently high luminous efficiency equal to that of a case wherein the light emitting layer is formed only from a direct transition type semiconductor can be obtained.

Figure 6:
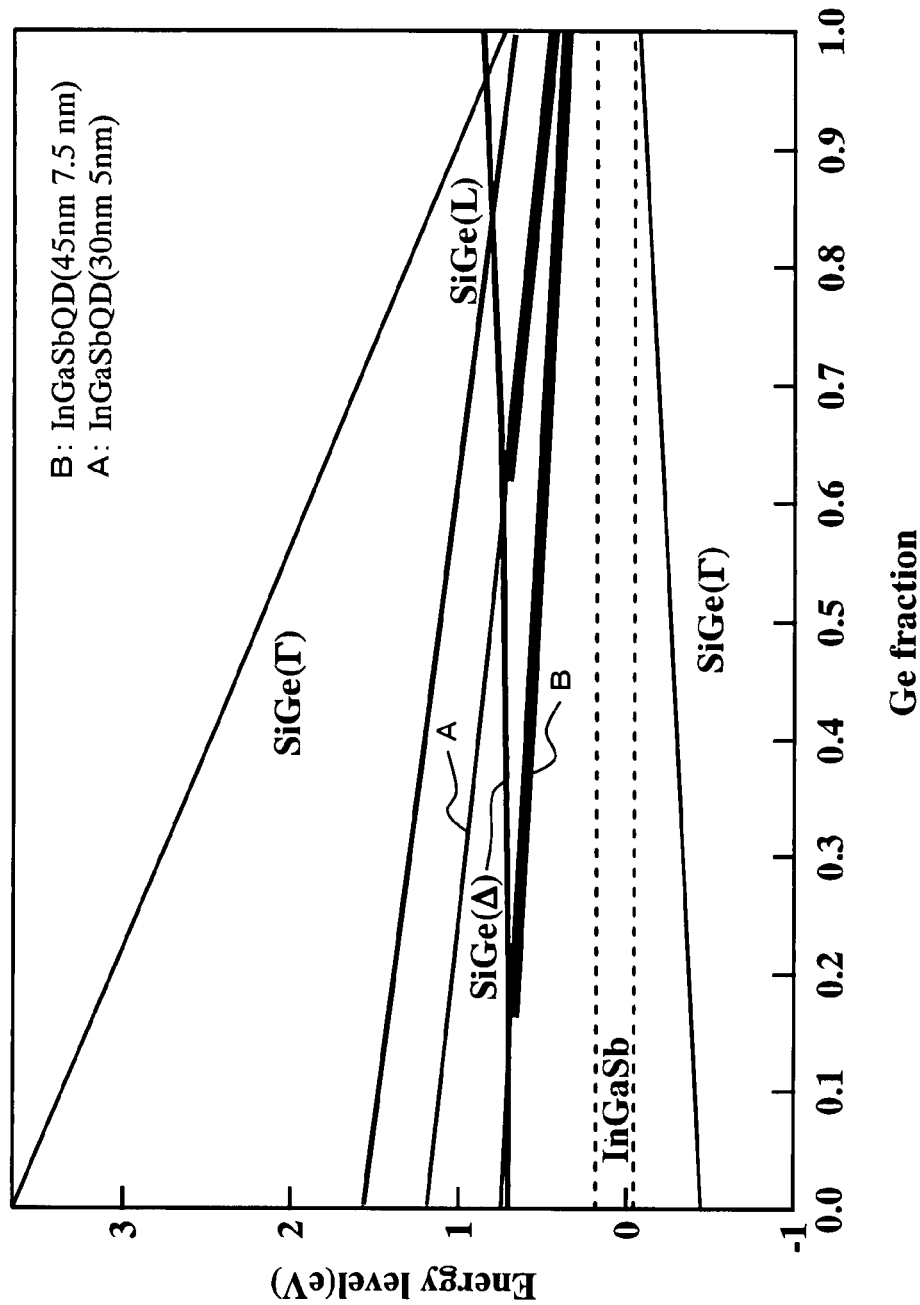
FIG. 6 is a view illustrating a variation of the energy band structure in response to the Ge ratio of $Si_{1-x}Ge_x$ ($0<x\leq1$) and a variation of the energy level of the ground level at the Γ point of a conduction band of direct transition type compound semiconductor quantum dots (InGaSb quantum dots) which form the light emitting device according to the first embodiment of the present invention.
Figure 7:
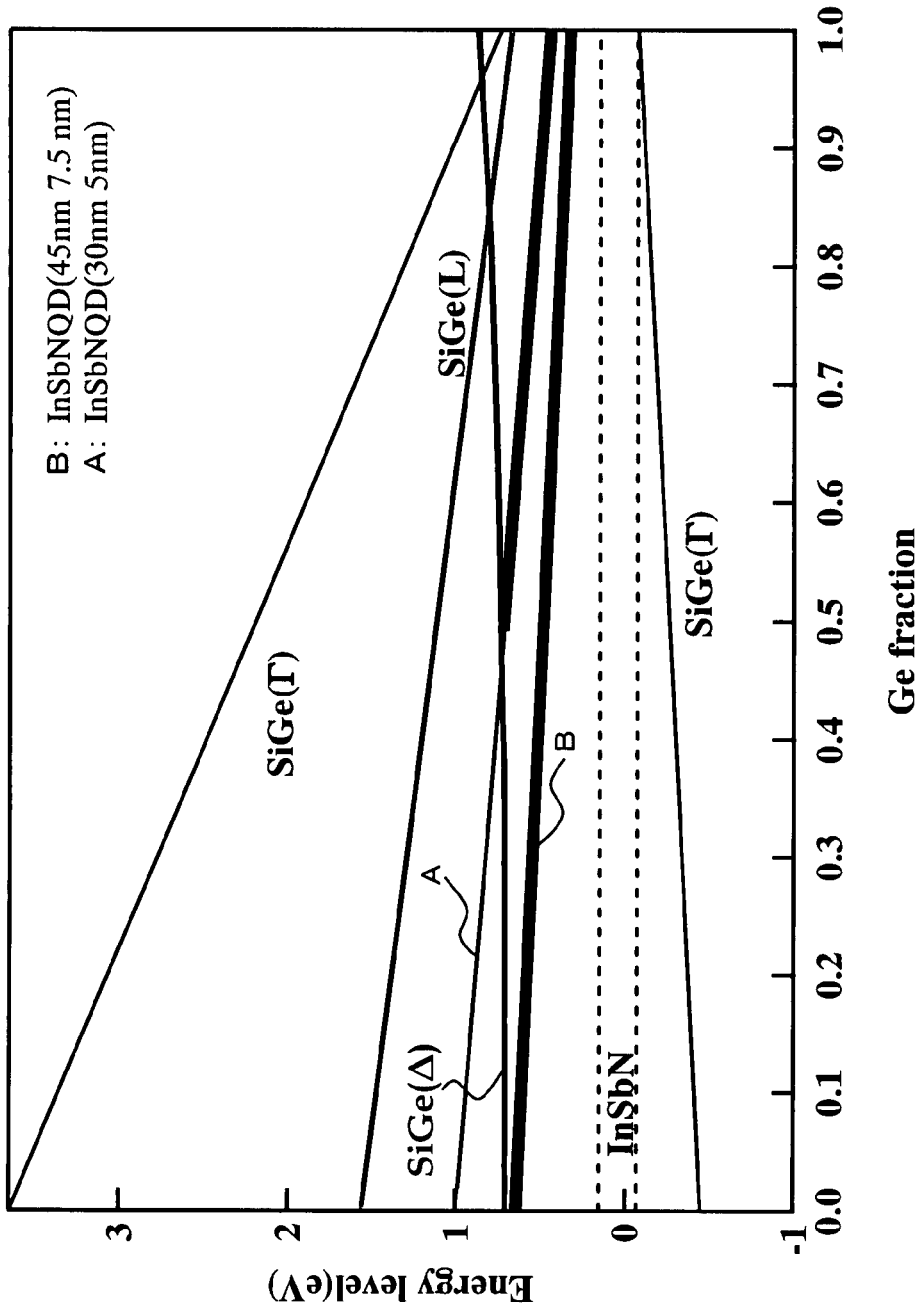
FIG. 7 is a view illustrating a variation of the energy band structure in response to the Ge ratio of $Si_{1-x}Ge_x$ ($0<x\leq1$) and a variation of the energy level of the ground level at the Γ point of a conduction band of direct transition type compound semiconductor quantum dots (InSbN quantum dots) which form the light emitting device according to the first embodiment of the present invention.

Next, in a case wherein the InGaSb quantum dots 3 are buried in the barrier layer 2 made of $Si_{1-x}Ge_x$ ($0<x\leq 1$), where the size of the quantum dots 3 is set such that the bottom length is 30 nm and the height is 5 nm, it is recognized that, if the value of x which indicates the ratio of Ge is within a range of $0.6\leq x\leq 1$ as indicated by the thick line on the solid line to which the reference character A is applied in FIG. 6, then the energy band structure shown in FIG. 2 can be implemented. Therefore, where the size of the quantum dots 3 is set such that the bottom length is 30 nm and the height is 5 nm, if the composition ratio of Ge is adjusted within the range specified as above, then a sufficiently high luminous efficiency equal to that of a case wherein the light emitting layer is formed only from a direct transition type semiconductor can be obtained.

On the other hand, where the size of the quantum dots 3 is set such that the bottom length is 45 nm and the height is 7.5 nm, it is recognized that, if the value of x which indicates the ratio of Ge is within a range of $0.16\leq x\leq 1$ as indicated by the thick line on the solid line to which the reference character B is applied in FIG. 6, then the energy band structure shown in FIG. 2 can be implemented. Therefore, where the size of the quantum dots 3 is set such that the bottom length is 45 nm and the height is 7.5 nm, if the composition ratio of Ge is adjusted within the range specified as above, then a sufficiently high luminous efficiency equal to that of a case wherein the light emitting layer is formed only from a direct transition type semiconductor can be obtained.

Next, in a case wherein the InSbN quantum dots 3 are buried in the barrier layer 2 made of $Si_{1-x}Ge_x$ ($0<x\leq 1$), where the size of the quantum dots 3 is set such that the bottom length is 30 nm and the height is 5 nm, it is recognized that, if the value of x which indicates the ratio of Ge is within a range of $0.48\leq x\leq 1$ as indicated by the thick line on the solid line to which the reference character A is applied in FIG. 7, then the energy band structure shown in FIG. 2 can be implemented. Therefore, where the size of the quantum dots 3 is set such that the bottom length is 30 nm and the height is 5 nm, if the composition ratio of Ge is adjusted within the range described above, then a sufficiently high luminous efficiency equal to that of a case wherein the light emitting layer is formed only from a direct transition type semiconductor can be obtained.

On the other hand, where the size of the quantum dots 3 is set such that the bottom length is 45 nm and the height is 7.5 nm, it is recognized that, if the value of x which indicates the ratio of Ge is within a range of $0<x\leq 1$ as indicated by the thick line on the solid line to which the reference character B is applied in FIG. 7, then the energy band structure shown in FIG. 2 can be implemented. Therefore, where the size of the quantum dots 3 is set such that the bottom length is 45 nm and the height is 7.5 nm, if the composition ratio of Ge is adjusted within the range specified as above, then a sufficiently high luminous efficiency equal to that of a case wherein the light emitting layer is formed only from a direct transition type semiconductor can be obtained.

Figure 8:
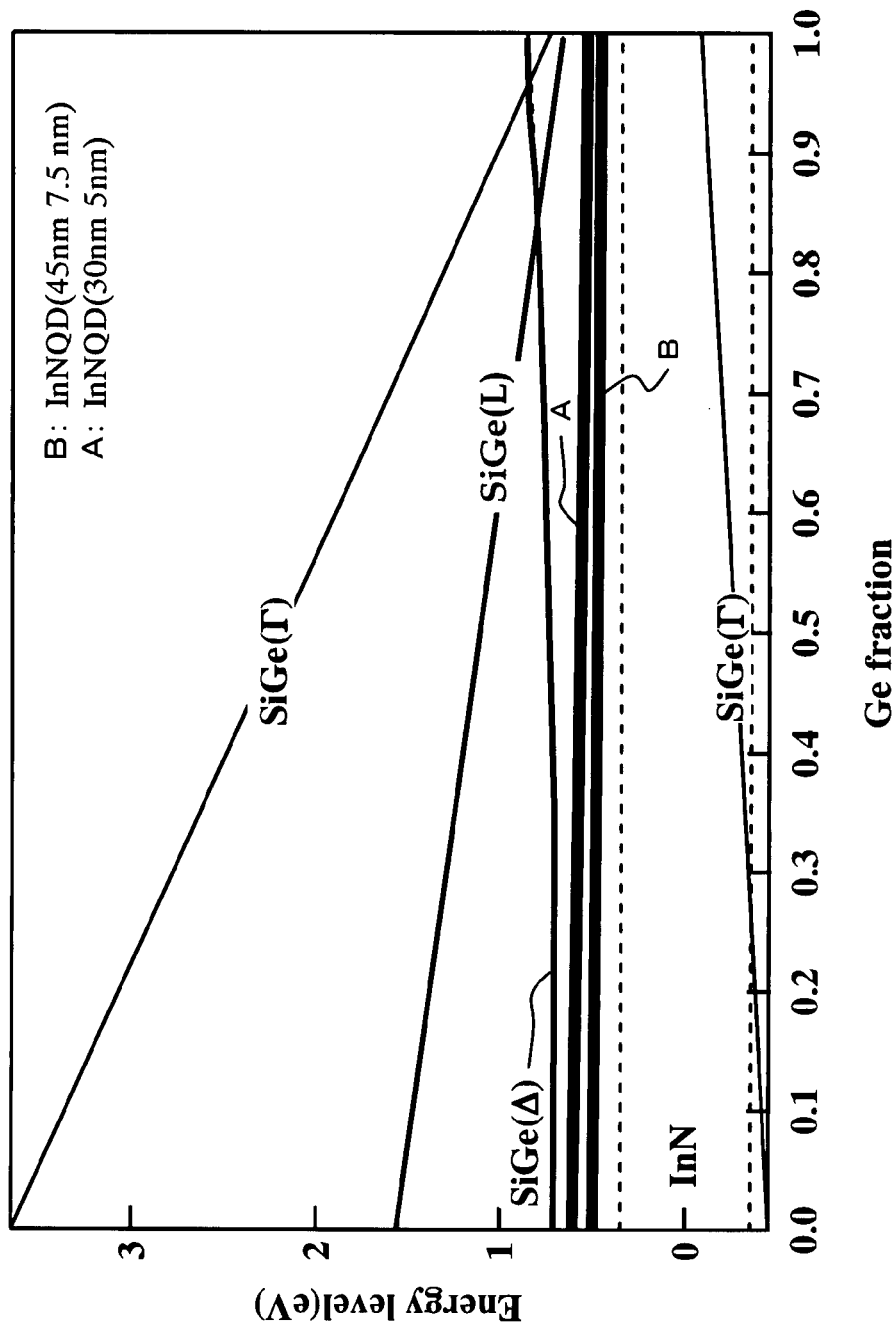
FIG. 8 is a view illustrating a variation of the energy band structure in response to the Ge ratio of $Si_{1-x}Ge_x$ ($0<x\leq1$) and a variation of the energy level of the ground level at the Γ point of a conduction band of direct transition type compound semiconductor quantum dots (InN quantum dots) which form the light emitting device according to the first embodiment of the present invention.

Next, in a case wherein the InN quantum dots 3 are buried in the barrier layer 2 made of $Si_{1-x}Ge_x$ ($0<x\leq 1$), where the size of the quantum dots 3 is set such that the bottom length is 30 nm and the height is 5 nm, it is recognized that, if the value of x which indicates the ratio of Ge is within a range of $0<x\leq 1$ as indicated by the thick line on the solid line to which the reference character A is applied in FIG. 8, then the energy band structure shown in FIG. 2 can be implemented. Therefore, where the size of the quantum dots 3 is set such that the bottom length is 30 nm and the height is 5 nm, if the composition ratio of Ge is adjusted within the range specified as above, then a sufficiently high luminous efficiency equal to that of a case wherein the light emitting layer is made only of a direct transition type semiconductor can be obtained.

On the other hand, where the size of the quantum dots 3 is set such that the bottom length is 45 nm and the height is 7.5 nm, it is recognized that, if the value of x which indicates the ratio of Ge is within a range of $0<x\leq 1$ as indicated by the thick line on the solid line to which the reference character B is applied in FIG. 8, then the energy band structure shown in FIG. 2 can be implemented. Therefore, where the size of the quantum dots 3 is set such that the bottom length is 45 nm and the height is 7.5 nm, if the composition ratio of Ge is adjusted within the range specified as above, then a sufficiently high luminous efficiency equal to that of a case wherein the light emitting layer is formed only from a direct transition type semiconductor can be obtained.

Figure 9:
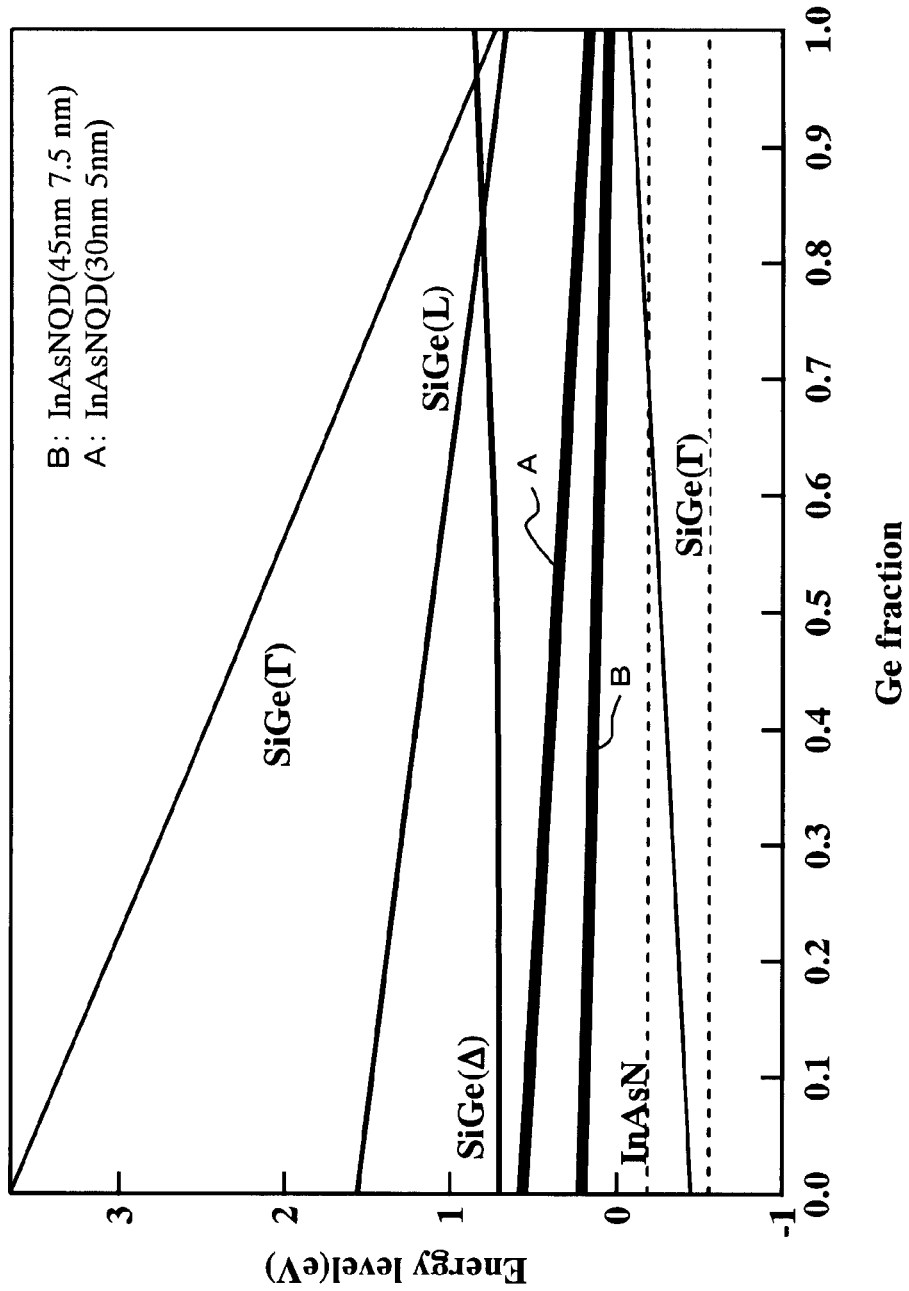
FIG. 9 is a view illustrating a variation of the energy band structure in response to the Ge ratio of $Si_{1-x}Ge_x$ ($0<x\leq1$) and a variation of the energy level of the ground level at the Γ point of a conduction band of direct transition type compound semiconductor quantum dots (InAsN quantum dots) which form the light emitting device according to the first embodiment of the present invention.

Next, in a case wherein the InAsN quantum dots 3 are buried in the barrier layer 2 made of $Si_{1-x}Ge_x$ ($0<x\leq 1$), where the size of the quantum dots 3 is set such that the bottom length is 30 nm and the height is 5 nm, it is recognized that, if the value of x which indicates the ratio of Ge is within a range of $0<x\leq 1$ as indicated by the thick line on the solid line to which the reference character A is applied in FIG. 9, then the energy band structure shown in FIG. 2 can be implemented. Therefore, where the size of the quantum dots 3 is set such that the bottom length is 30 nm and the height is 5 nm, if the composition ratio of Ge is adjusted within the range specified as above, then a sufficiently high luminous efficiency equal to that of a case wherein the light emitting layer is formed only from a direct transition type semiconductor can be obtained.

On the other hand, where the size of the quantum dots 3 is set such that the bottom length is 45 nm and the height is 7.5 nm, it is recognized that, if the value of x which indicates the ratio of Ge is within a range of $0<x\leq 1$ as indicated by the thick line on the solid line to which the reference character B is applied in FIG. 9, then the energy band structure shown in FIG. 2 can be implemented. Therefore, where the size of the quantum dots 3 is set such that the bottom length is 45 nm and the height is 7.5 nm, if the composition ratio of Ge is adjusted within the range specified as above, then a sufficiently high luminous efficiency equal to that of a case wherein the light emitting layer is formed only from a direct transition type semiconductor can be obtained.

It is to be noted here that, while the description here is given taking the case wherein the barrier layer 2 is formed from a $Si_{1-x}Ge_x$ ($0<x\leq 1$) layer as an example, also in an alternative case wherein the barrier layer 2 is formed from a $Si_{1-x-y}Ge_xC_y$ ($0<x\leq 1$, $0\leq y\leq 0.005$) layer, a similar tendency is obtained (although the energy level generally drops).

Where the structure is applied wherein the quantum dots 3 made of a direct transition type compound semiconductor are buried in the barrier layer 2 made of $Si_{1-x-y}Ge_xC_y$ ($0<x\leq 1$, $0\leq y\leq 0.005$) in this manner, if the size or composition of the quantum dots 3 or the composition (in particular, ratio of Ge) of $Si_{1-x-y}Ge_xC_y$ ($0<x\leq 1$, $0\leq y\leq 0.005$) is adjusted, then a sufficiently high luminous efficiency can be obtained.

Further, as apparent from comparison between the case wherein the size of the quantum dots 3 is set such that the bottom length is 30 nm and the height is 5 nm and the case wherein the size of the quantum dots 3 is set such that the bottom length is 45 nm and the height is 7.5 nm in FIGS. 3 to 9, it is recognized that the slope of the solid lines (reference characters A, B) which indicate the variations of the energy level of the ground level (quantum level) at the Γ point of the conduction band of the quantum dots 3 decreases and the region of the thick line expands as the size of the quantum dots 3 increases. Therefore, the degree of freedom of the design increases as the size of the quantum dots 3 increases.

Further, as apparent from FIGS. 3 to 9, the energy level of the ground level at the Γ point of the conduction band of the direct transition type compound semiconductor quantum dots 3 rises as the ratio of Ge decreases. In other words, the transition energy $E_{QD}$ (eV) increases as the ratio of Ge decreases. As hereinafter described, since the emission wavelength varies in response to the transition energy $E_{QD}$, the degree of freedom of the design increases as the variation of the transition energy $E_{QD}$ increases in response to the ratio of Ge.

Next, the emission wavelength of the light emitting element configured as described above is described.

Generally, where the energy gap is represented by Eg (eV) and the Planck constant is represented by h and the velocity of light is represented by c, the emission wavelength λ can be determined by the following expression (1).

[expression 1]
$$\lambda = \frac{hc}{E_g} = \frac{1.24}{E_g} \ (\mu m) \quad (1)$$

In the case of a low-dimensional quantum structure like that of quantum dots, the transition energy $E_{QD}$ (eV) is higher than the energy gap Eg by an amount corresponding to quantization energy and the emission wavelength varies as shown in FIG. 2. However, the emission wavelength $\lambda_{QD}$ can be determined by a next expression (2) similarly to the emission wavelength λ.

[expression 2]
$$\lambda_{QD} = \frac{1.24}{E_{QD}} \ (\mu m) \quad (2)$$

For example, the emission wavelength is calculated taking a case wherein two kinds of sizes of the InSb quantum dots 3 described hereinabove are buried in the barrier layer 2 made of $Si_{1-x}Ge_x$ (0<x≦1) as an example having a specially high luminous efficiency.

While the emission wavelength becomes the shortest wavelength in a case wherein the InSb quantum dots 3 whose size is set such that the bottom length is 30 nm and the height is 5 nm are buried in the $Si_{0.4}Ge_{0.6}$ layer 2, since the transition energy in this case is 0.8 eV (refer to FIG. 3), the emission wavelength is 1.55 μm.

While the emission wavelength becomes the longest wavelength in a case wherein the InSb quantum dots 3 whose size is set such that the bottom length is 45 nm and the height is 7.5 nm are buried in the Ge layer 2, since the transition energy in this case is 0.37 eV (refer to FIG. 3), the emission wavelength is 3.35 μm.

In this manner, where the InSb quantum dots 3 are buried in the barrier layer 2 made of $Si_{1-x}Ge_x$ (0<x≦1), if the size or the composition of the quantum dots or the composition (in particular, ratio of Ge) of $Si_{1-x}Ge_x$ (0<x≦1) is adjusted, then the quantum dots 3 whose emission wavelength is within a range of 1.55 to 3.35 μm can be designed arbitrarily.

Therefore, if a structure is applied wherein the quantum dots 3 made of a direct transition type compound semiconductor are buried in the barrier layer 2 made of $Si_{1-x-y}Ge_xC_y$ (0<x≦1, 0≦y≦0.005) and the size or composition of the quantum dots 3 or the composition (in particular, ratio of Ge) of $Si_{1-x-y}Ge_xC_y$ (0<x≦1, 0≦y≦0.005) is adjusted, then the emission wavelength can be designed arbitrarily within a predetermined wavelength range (for example, 1.5 to 7 μm).

Next, a fabrication method for the light emitting device (light emitting element) according to the present embodiment is described.

It is to be noted that crystal growth can be performed by the organometallic vapor phase growth (MOVPE) method or the molecular beam epitaxy method.

First, as shown in FIG. 1, $Si_{1-x-y}Ge_xC_y$ (0<x≦1, 0≦y≦0.005) is grown up on a substrate 1 made of a Si material system to form a $Si_{1-x-y}Ge_xC_y$ (0<x≦1, 0≦y≦0.005) underlying layer 2A. For example, with the growth temperature set to 650° C., $Si_{0.6}Ge_{0.4}$ is grown up on the Si substrate 1 by 50 nm to form a $Si_{0.6}Ge_{0.4}$ underlying layer 2A. It is to be noted that, for example, disilane ($Si_2H_6$) and germane ($GeH_4$) may be used for the growth of $Si_{0.6}Ge_{0.4}$ by the MOVPE method.

Next, quantum dots 3 made of a direct transition type compound semiconductor are formed on the $Si_{1-x-y}Ge_xC_y$ (0<x≦1, 0<y≦0.005) underlying layer 2A. Here, a plurality of quantum dots 3 are formed on the same plane and the plural quantum dots 3 form a quantum dot layer of one layer, and this quantum dot layer functions as the light emitting layer. It is to be noted that also there is a case wherein the entirety of the quantum dots 3 and the $Si_{1-x-y}Ge_xC_y$ (0<x≦1, 0≦y≦0.005) barrier layer 2 in which the quantum dots 3 are buried functions as the light emitting layer.

For example, the growth temperature is set to 500° C., and the supplying amount of In which is a group III element is 2 ML (here, the size of the quantum dots 3 is adjusted by the supplying amount), and the ratio (V/III ratio) between As and Sb which are group V elements and In which is a group III element is set to 10. Then, the quantum dots 3 made of $InAs_{0.1}Sb_{0.9}$ are grown up on the $Si_{0.6}Ge_{0.4}$ underlying layer 2A. It is to be noted that, for the growth of $InAs_{0.1}Sb_{0.9}$ by the MOVPE method, for example, trimethyl indium (TMIn), arsine ($AsH_3$) or trimethyl antimony (TMSb) may be used.

It is to be noted that, since, for example, $Si_{1-x}Ge_x$ (0<x≦1) and $InAs_{1-a}Sb_a$ (0≦a≦1) are of the lattice mismatching type, if $InAs_{1-a}Sb_a$ (0≦a≦1) is grown up on $Si_{1-x}Ge_x$ (0<x≦1) by the epitaxial growth method, then self formation type quantum dots can be formed by the Stranski-Krastanov (S-K) growth mode or the Volmer-Weber (V-W) growth mode. Since the size of each of the quantum dots 3 formed in such a manner as described above is small different from that in a case wherein a group III-V compound semiconductor light emitting device is formed directly on the Si substrate 1, an anti-phase domain is not produced and the quantum dot layer formed from such quantum dots 3 as described above satisfactorily functions as the light emitting layer.

Next, $Si_{1-x-y}Ge_xC_y$ (0<x≦1, 0≦y≦0.005) is grown up to form a $Si_{1-x-y}Ge_xC_y$ (0<x≦1, 0≦y≦0.005) cap layer 2B so that the quantum dots are buried therein. For example, with the growth temperature set to 500° C., $Si_{0.6}Ge_{0.4}$ is grown up by 20 nm to form a $Si_{0.6}Ge_{0.4}$ cap layer 2B.

Consequently, a light emitting device having a structure wherein the quantum dots 3 made of a direct transition type compound semiconductor are buried in the $Si_{1-x-y}Ge_xC_y$ ($0<x\leqq1$, $0\leqq y\leqq0.005$) barrier layer 2 is formed on the substrate 1 made of a Si material system. For example, a light emitting device having a structure wherein the quantum dots 3 made of $InAsSb_{0.9}$ are buried in the $Si_{0.6}Ge_{0.4}$ barrier layer 2 is formed on the Si substrate 1.

It is to be noted that, while the $Si_{0.6}Ge_{0.4}$ barrier layer 2 here is grown up directly on the Si substrate 1, the growth of the $Si_{0.6}Ge_{0.4}$ barrier layer 2 is not limited to this. In order to enhance the crystallinity of the $Si_{0.6}Ge_{0.4}$ barrier layer 2, for example, a graded composition buffer layer made of $Si_{1-x-y}Ge_xC_y$ ($0<x\leqq1$, $0\leqq y\leqq0.005$) or $Si_{1-x-y}Ge_x$ ($0<x\leqq1$) or a Si buffer layer (for example, low temperature Si buffer layer) may be inserted between the Si substrate 1 and the $Si_{0.6}Ge_{0.4}$ barrier layer 2.

Accordingly, with the light emitting device (light emitting element) according to the present embodiment, there is an advantage that it is possible to grow up (directly grow up) the light emitting device easily on the substrate 1 made of a Si material system while production of an anti-phase domain is prevented and a sufficiently high luminous efficiency can be obtained. Consequently, a semiconductor device can be implemented wherein the light emitting device capable of obtaining a sufficiently high luminous efficiency and an electron device are integrated (refer to third embodiment hereinafter described). Also there is an advantage that the emission wavelength can be designed arbitrarily within a predetermined wavelength range (for example, 1.5 to 7 μm).

It is to be noted that, while the quantum dot layer in the present embodiment is configured as a single layer, the quantum dot layer is not limited this, but, for example, a quantum dot layer formed from multi layers may be provided. Where a quantum dot layer formed from multi layers is provided, it is preferable to provide, for example, a spacer layer of 30 nm made of $Si_{1-x-y}Ge_xC_y$ ($0<x\leqq1$, $0\leqq y\leqq0.005$) or $Si_{1-x-y}Ge_x$ ($0<x\leqq1$) between the quantum dot layers.

Second Embodiment

Next, a light emitting device (light emitting element) according to a second embodiment of the present invention is described with reference to FIG. 10.

The light emitting device according to the present embodiment is a light emitting diode (LED) to which the present invention is applied.

The present LED is a Si type LED. The present LED is a LED using quantum dots 3 and is formed on a Si substrate 1 as shown in FIG. 10. It is to be noted that, in FIG. 10, like elements to those in the first embodiment (refer to FIG. 1) are denoted by like reference characters.

Figure 10:
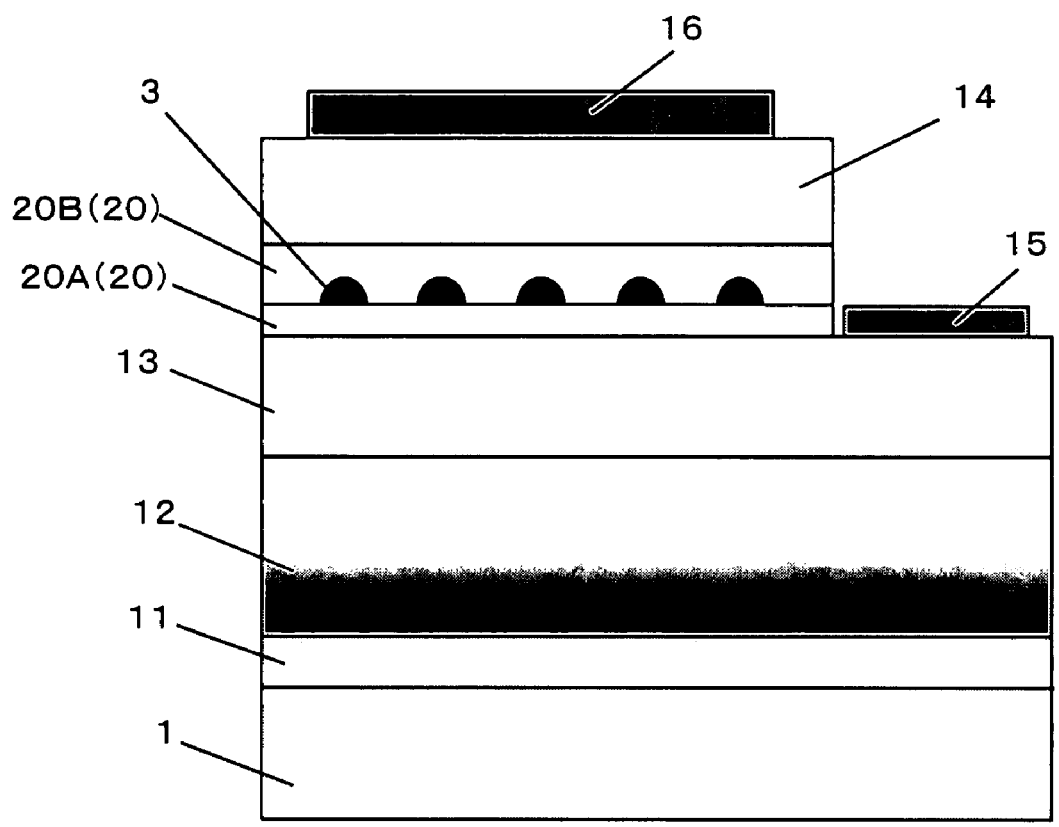
FIG. 10 is a schematic view showing a configuration of an LED as a light emitting device according to a second embodiment of the present invention.

In particular, as shown in FIG. 10, the present LED includes a Si substrate 1, a Si buffer layer 11, a graded composition buffer layer (Graded buffer layer) 12 made of $Si_{1-x-y}Ge_xC_y$ ($0<x\leqq1$, $0\leqq y\leqq0.005$) or $Si_{1-x-y}Ge_x$ ($0<x\leqq1$), an n-type $Si_{1-x}Ge_x$ ($0<x\leqq1$) contact layer (n-type contact layer) 13 in which arsenic (As) is doped, a $Si_{1-x-y}Ge_xC_y$ ($0<x\leqq1$, $0\leqq y\leqq0.005$) layer (Ge layer or group IV semiconductor mixed crystal layer including Si) 20, quantum dots 3 made of a direct transition type compound semiconductor, a p-type $Si_{1-x}Ge_x$ ($0<x\leqq1$) contact layer (p-type contact layer) 14 in which boron (B) is doped, an n-side electrode 15, and a p-side electrode 16.

Here, similarly as in the first embodiment described above, the quantum dots 3 are buried in the $Si_{1-x-y}Ge_xC_y$ ($0<x\leqq1$, $0\leqq y\leqq0.005$) layer 20 formed above the Si substrate 1.

It is to be noted that the n-type contact layer 13 may be formed from n-type $Si_{1-x-y}Ge_xC_y$ ($0<x\leqq1$, $0\leqq y\leqq0.005$) in which As is doped. Meanwhile, the p-type contact layer 14 may be formed from p-type $Si_{1-x-y}Ge_xC_y$ ($0<x\leqq1$, $0\leqq y\leqq0.005$) in which B is doped.

Further, the configuration of the $Si_{1-x-y}Ge_xC_y$ ($0<x\leqq1$, $0\leqq y\leqq0.005$) layer 20 is same as that in the first embodiment described above.

Next, a fabrication method for the light emitting device (LED) according to the present embodiment is described.

It is to be noted that crystal growth can be performed by the organometallic vapor phase growth (MOVPE) method or the molecular beam epitaxy method.

First, as shown in FIG. 10, a Si buffer layer 11 (for example, 0.1 μm thick), a graded composition buffer layer (Graded buffer layer) 12 (for example, 1 μm thick) and an n-type contact layer 13 (for example, 1 μm thick) are grown up in order on a substrate 1 made of a Si material system to form the layers.

Here, the thickness of the Si buffer layer 11 is set to, for example, 0.1 μm while the thickness of the graded composition buffer layer 12 is set to, for example, 1 μm, and the thickness of the n-type contact layer 13 is set to, for example, 1 μm. Further, as the n-type contact layer 13, an n-$Si_{0.7}Ge_{0.3}$ layer in which, for example, As is doped by $5\times10^{18}$ $cm^{-3}$ is formed.

Next, $Si_{1-x-y}Ge_xC_y$ ($0<x\leqq1$, $0\leqq y\leqq0.005$) is grown up to form a $Si_{1-x-y}Ge_xC_y$ ($0<x\leqq1$, $0\leqq y\leqq0.005$) underlying layer 20A. For example, with the growth temperature set to 650° C., $Si_{0.6}Ge_{0.4}$ is grown up on the Si substrate 1 by 50 nm to form the $Si_{0.6}Ge_{0.4}$ underlying layer 20A. It is to be noted that, for example, disilane ($Si_2H_6$) and germane ($GeH_4$) may be used for the growth of $Si_{0.6}Ge_{0.4}$ by the MOVPE method.

Next, quantum dots 3 made of a direct transition type compound semiconductor are formed on the $Si_{1-x-y}Ge_xC_y$ ($0<x\leqq1$, $0\leqq y\leqq0.005$) underlying layer 20A. Here, a plurality of quantum dots 3 are formed on the same plane, and the plural quantum dots 3 are formed as a quantum dot layer of a single layer, and this quantum dot layer functions as an active layer (light emitting layer). It is to be noted that also there is a case wherein the entirety of the quantum dots 3 and the $Si_{1-x-y}Ge_xC_y$ ($0<x\leqq1$, $0\leqq y\leqq0.005$) layer 20 in which the quantum dots 3 are buried functions as the active layer (light emitting layer).

For example, the growth temperature is set to 500° C. and the supplying amount of In which is a group III element is set to 2 ML and besides the ratio between As and Sb which are group V elements and In which is a group III element is set to 10 to grow up the quantum dots 3 made of $InAs_{0.1}Sb_{0.9}$ on the $Si_{0.6}Ge_{0.4}$ layer 20A. It is to be noted that, for example, trimethyl indium (TMIn), arsine ($AsH_3$) and trimethyl antimony (TMSb) may be used for the growth of $InAs_{0.1}Sb_{0.9}$ by the MOVPE method.

It is to be noted that, since, for example, $Si_{1-x}Ge_x$ ($0<x\leqq1$) and $InAs_{1-a}Sb_a$ ($0\leqq a\leqq1$) are of the lattice mismatching type, if $InAs_{1-a}Sb_a$ ($0\leqq a\leqq1$) is grown up on $Si_{1-x}Ge_x$ ($0<x\leqq1$) by the epitaxial growth, then self-formation type quantum dots can be formed by the Stranski-Krastanov (S-K) growth mode or the Volmer-Weber (V-W) growth mode. Since the size of each of the quantum dots 3 formed in such a manner as described above is small different from that in a case wherein a group III-V compound semiconductor light emitting device is formed directly on the Si substrate 1, an anti-phase domain is not produced, and the quantum dot layer formed from such quantum dots 3 as described above suitably functions as an active layer (light emitting layer).

Next, $Si_{1-x-y}Ge_xC_y$ ($0<x\leqq1$, $0\leqq y\leqq0.005$) is grown up to form a $Si_{1-x-y}Ge_xC_y$ ($0<x\leqq1$, $0\leqq y\leqq0.005$) cap layer 20B such that the quantum dots 3 are buried. For example, the growth temperature is set to 500° C. to grow up $Si_{0.6}Ge_{0.4}$ by 50 nm to form the $Si_{0.6}Ge_{0.4}$ cap layer 20B.

Consequently, the structure wherein the quantum dots 3 made of a direct transition type compound semiconductor are buried in the $Si_{1-x-y}Ge_xC_y$ ($0<x\leq1, 0\leq y\leq0.005$) barrier layer 20 is formed on the substrate 1 made of a Si material system. For example, the structure wherein the quantum dots 3 made of $InAs_{0.1}Sb_{0.9}$ are buried in the barrier layer 20 made of $Si_{0.6}Ge_{0.4}$ is formed on the Si substrate 1.

It is to be noted that, while the quantum dot layer here is formed as a single layer, the quantum dot layer is not limited to this, but, for example, a quantum dot layer of multi layers may be formed. Where a quantum dot layer of multi layers is formed, it is preferable to form a spacer layer of 30 nm made of $Si_{1-x-y}Ge_xC_y$ ($0<x\leq1, 0\leq y\leq0.005$) or $Si_{1-x-y}Ge_x$ ($0<x\leq1$) between the quantum dot layers.

Next, p-type $Si_{1-x}Ge_x$ ($0<x\leq1$) in which B is doped by $1\times10^{18}$ cm$^{-3}$ is grown up to form a p-type contact layer 14. For example, p-$Si_{0.7}Ge_{0.3}$ is grown up by 100 nm to form the p-$Si_{0.7}Ge_{0.3}$ contact layer 14.

After the layers are grown up in such a manner as described above, part of the stacked structure is etched by the photolithography technique until the n-type contact layer 13 (for example, n-$Si_{0.7}Ge_{0.3}$ layer) is exposed.

Then, an n-side electrode (metal electrode) 15 is formed on the surface of the n-type contact layer 13 (for example, n-$Si_{0.7}Ge_{0.3}$ layer), for example, by the vapor deposition method. The n-side electrode 15 maybe formed, for example, from an Au—Sb alloy and the thickness of the n-side electrode 15 may be set, for example, to approximately 100 nm.

On the other hand, a p-side electrode (metal electrode) 16 is formed on the surface of the p-type contact layer 14, for example, by the vapor deposition method. The p-side electrode 16 may be formed, for example, from a Au—Ga alloy and the thickness of the p-side electrode 16 may be set, for example, to approximately 100 nm.

Consequently, an LED having the structure wherein the quantum dots 3 made of a direct transition type compound semiconductor are buried in the $Si_{1-x-y}Ge_xC_y$ ($0<x\leq1$, $0\leq y\leq0.005$) barrier layer 20 is formed on the substrate 1 made of a Si material system. For example, an LED having the structure wherein the quantum dots 3 made of $InAs_{0.1}Sb_{0.9}$ are buried in the $Si_{0.6}Ge_{0.4}$ barrier layer 20 is formed on the Si substrate 1.

Accordingly, with the light emitting device (LED) according to the present embodiment, there is an advantage that the light emitting device can be grown up (directly grown up) easily on the substrate 1 made of a Si material system while production of an anti-phase domain is prevented and a sufficiently high light emission efficiency can be obtained. Consequently, a semiconductor device can be implemented wherein a light emitting device capable of obtaining a sufficiently high light emission efficiency and an electronic device are integrated (refer to a third embodiment hereinafter described). Also there is an advantage that the emission wavelength can be designed arbitrarily within a predetermined wavelength range (for example, 1.5 to 7 μm).

It is to be noted that the structure of the LED is not limited to that in the embodiments described above, but the present invention can be applied also to a structure of a different LED or LD (laser diode) which is known publicly.

Third Embodiment

Next, a semiconductor apparatus (semiconductor device) according to the third embodiment of the present invention is described with reference to FIG. 11.

The semiconductor device according to the present embodiment is an optoelectronic integrated apparatus (optoelectronic integrated device, optoelectronic integrated element) to which the light emitting device of the present invention is applied.

Figure 11:
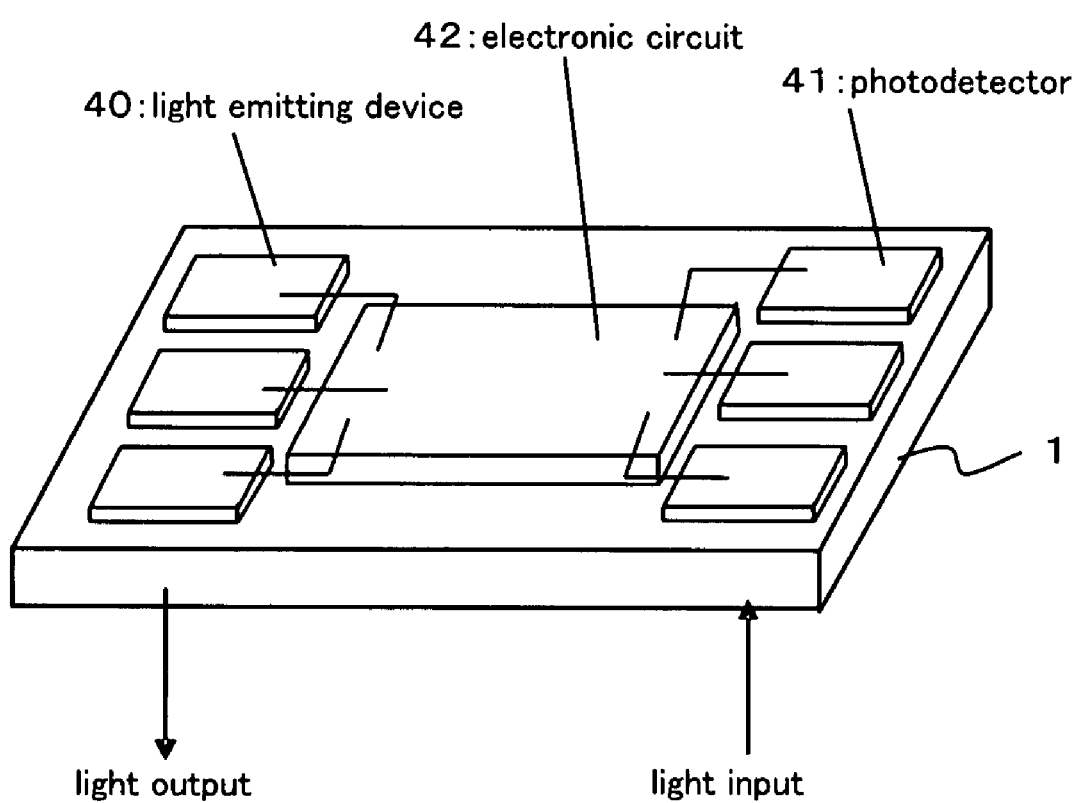
FIG. 11 is a schematic view showing a configuration of a semiconductor device according to a third embodiment of the present invention.

As shown in FIG. 11, the present semiconductor device is configured such that a light emitting element (light emitting device) 40, a photodetector (light receiving device) 41 and an electronic circuit (electronic element, electronic device) 42 are integrated on a Si substrate 1. It is to be noted that, in FIG. 11, like elements to those in the first embodiment described hereinabove (refer to FIG. 1) are denoted by like reference characters.

Here, as the light emitting device 40, the light emitting device according to the first embodiment described hereinabove or the LED according to the second embodiment described hereinabove is used.

The photodetector 41 is configured such that, for example, a Si layer and a $Si_{1-x-y}Ge_xC_y$ ($0<x\leq1, 0\leq y\leq0.005$) layer are stacked (Si/SiGe photodetector).

While a Si substrate is used as the substrate 1, any substrate made of a Si material system (in particular, Si or group IV semiconductor mixed crystal including Si) may be used.

In an optoelectronic integrated device having such a configuration as described above, inputted light is converted from an optical signal into an electric signal by the photodetector 41, and various processes such as, for example, calculation and so forth are performed by the electronic circuit 42. Then, the electric signal is converted into an optical signal by the light emitting device 40, and the resulting signal is outputted.

Accordingly, where the light emitting devices according to the first and second embodiments are used for the light emitting device as in the semiconductor apparatus according to the present embodiment, a semiconductor apparatus can be implemented wherein a light emitting device capable of obtaining a sufficiently high light emission efficiency and an electronic device are integrated.

It is to be noted that the configuration of the semiconductor apparatus is not limited to that of the present embodiment, but the light emitting device of the present invention can be applied as a light emitting device of a publicly known optoelectronic integrated element (optoelectronic integrated circuit, semiconductor apparatus).

The invention claimed is:

1. A light emitting device, comprising:
   a substrate made of a Si material system, a $Si_{1-x-y}Ge_xC_y$ ($0<x\leq1, 0\leq y\leq0.005$) layer, and quantum dots made of a direct transition type compound semiconductor;
   said quantum dots being provided in said $Si_{1-x-y}Ge_xC_y$ ($0<x\leq1, 0\leq y\leq0.005$) layer formed above said substrate.

2. The light emitting device as set forth in claim 1, wherein said $Si_{1-x-y}Ge_xC_y$ ($0<x\leq1, 0\leq y\leq0.005$) layer is a SiGe layer or a SiGeC layer.

3. The light emitting device as set forth in claim 1, wherein said direct transition type compound semiconductor is one of $InAs_{1-y}Sb_y$ ($0\leq y\leq1$), $InGa_{1-z}Sb_z$ ($0\leq z\leq1$), $InSb_{1-a}N_a$ ($0\leq a\leq1$) and $InAs_{1-b}N_a$ ($0\leq b\leq1$).

4. The light emitting device as set forth in claim 1, wherein the ground level of the Ć point of the conduction band of said quantum dots is lower than the conduction band minimum (Δ or L point) of said $Si_{1-x-y}Ge_xC_y$ ($0<x\leq1, 0\leq y\leq0.005$) layer.

5. The light emitting device as set forth in claim 1, wherein a buffer layer is provided between said substrate and said $Si_{1-x-y}Ge_xC_y$ ($0<x\leq1, 0\leq x\leq0.005$) layer.

6. The light emitting device as set forth in claim 1, wherein said Si material system is Si or group IV semiconductor mixed crystal including Si.

7. A semiconductor device, comprising:
   the light emitting device as set forth in claim 1.

8. A semiconductor device configured by integrating the light emitting device as set forth in claim 1 and an electronic device.

* * * * *